United States Patent
Kang et al.

(10) Patent No.: US 7,019,545 B2
(45) Date of Patent: Mar. 28, 2006

(54) METHOD FOR MONITORING QUALITY OF AN INSULATION LAYER

(75) Inventors: Ting-Kuo Kang, Kao-Hsiung Hsien (TW); Yi-Fan Chen, Tai-Chung (TW); Chia-Jen Kao, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 60 days.

(21) Appl. No.: 10/710,724

(22) Filed: Jul. 30, 2004

(65) Prior Publication Data

US 2005/0040840 A1    Feb. 24, 2005

Related U.S. Application Data

(63) Continuation-in-part of application No. 10/065,432, filed on Oct. 17, 2002, now Pat. No. 6,894,517.

(51) Int. Cl.
  *G01R 31/02*    (2006.01)

(52) U.S. Cl. .................................... 324/765; 324/158.1

(58) Field of Classification Search ..................... None
See application file for complete search history.

(56) References Cited

U.S. PATENT DOCUMENTS 4,542,340 A * 9/1985 Chakravarti et al. ........ 324/769
6,326,792 B1 * 12/2001 Okada ......................... 324/456

OTHER PUBLICATIONS

S. Satoh et al, "Stress Induced Leakage Current of Tunnel Oxide Derived From Flash Memory Read-Disturb Characteristics," Mar. 1995, Proc. IEEE 1995 Int. Conference on Microelectronic Test Structures, vol. 8, pp. 97-101.*

Guoqiao Tao et al, "Fast wafer level monitoring of stress induced leakage current in deep sub-micron embedded non-volatile memory processes," 2002 (Month Unavailable), IEEE, 2002 IRW Final Report, pp. 76-78.*

* cited by examiner

*Primary Examiner*—Vinh Nguyen
*Assistant Examiner*—Russell M. Kobert
(74) *Attorney, Agent, or Firm*—Winston Hsu

(57) ABSTRACT

The present invention utilizes wafer acceptance testing equipment to fast monitor the quality of an insulation layer. A plurality of swing time-dependent DC ramping voltages are applied to one of the electrode plates in a capacitor and each corresponding leakage current is measured to calculate each corresponding β value. Then, a ratio of each β value is calculated and a β-voltage curve is plotted to actually simulate the device failure.

42 Claims, 15 Drawing Sheets

METHOD FOR MONITORING QUALITY OF AN INSULATION LAYER

CROSS REFERENCE TO RELATED APPLICATIONS

This is a continuation-in-part of U.S. application Ser. No. 10/065,432, filed Oct. 17, 2002 U.S. Pat. No. 6,894,517, and which is included herein by reference.

BACKGROUND OF INVENTION

1. Field of the Invention

The present invention provides a method for monitoring quality of an insulation layer, and more particularly, relates to a method for quickly monitoring the stress-induced degradation of an insulation layer in different structures with wafer acceptance testing (WAT) equipment.

2. Description of the Prior Art

In today's electronics industry, semiconductor devices make extensive use of the unique characteristics of semiconductor materials. Most recently, transistors known as metal-oxide-semiconductor (MOS) transistors have been created that consume less power and can be highly integrated. These tiny transistors have been widely used in various electronic devices and circuits. Non-volatile memory, such as the frequently seen flash ROM or other electrically erasable programmable ROM (EEPROM), is one kind of memory. Once information or data is stored into the non-volatile memory, the stored information or data will not disappear due to the interruption of power supply. The non-volatile memory thus is able to retain data and becomes a key component in the electronics industry. Besides MOS transistors and non-volatile memories, many different devices or structures, such as resistors, capacitors, inductors, interconnection structures, etc., are formed on the semiconductor wafers to constitute different circuits.

In order to fabricate satisfied semiconductor products, qualities of the above-mentioned devices should be well controlled. When considering the qualities of MOS transistors, non-volatile memories, capacitors, and interconnect structures, the qualities of the insulation layers, having various compositions, in these devices or structure become important issues. Therefore, it is very important to monitor qualities of the insulation layers in these devices on the production line.

Actually, the stress-induced degradation of the insulation layer tends to occur, no matter what kind of insulation layer is. In the following, a flash ROM is taken as an example, to illustrate the stress-induced degradation phenomenon. Flash ROM, regarded as one kind of non-volatile memory, usually utilizes a floating gate composed of polysilicon or metal for storing charges. Therefore, an extra gate exists aside from a typical control gate when compared with MOS. Please refer to FIG. 1 and FIG. 2. FIG. 1 and FIG. 2 are schematic diagrams of writing and erasing a flash ROM cell 10. As shown in FIG. 1, the flash ROM cell 10 is fabricated on a semiconductor substrate 12. The flash ROM cell 10 comprises a floating gate 14 and a control gate 16. Two N-type doping areas 18 are set in the semiconductor substrate 12 at two sides of the floating gate 14 and the control gate 16, and a channel 22 is defined between the two N-type doping areas 18.

When writing to the cell, hot electrons tunnel through a thin silicon dioxide layer (not shown) beneath the floating gate 14, enter the floating gate 14, and are trapped in the floating gate 14. Storing negative charges in the floating gate 14 represents storing a data "1" in the flash ROM cell 10, as opposed to storing a "0". To electrically erase a memory state of the flash ROM cell 10, adequate negative voltage must be applied to the control gate 16 of the flash ROM cell 10. The electrons trapped in the floating gate 14 tunnel through the thin silicon dioxide layer (not shown) beneath the floating gate 14 again, and escape from the floating gate 14. The data stored in the flash ROM cell 10 is erased, the state before storing information is recovered, and new information can be written into the flash ROM cell 10.

However, when electrons or holes flow through the channel, they are apt to be affected by an electric field and gain energy to become a so-called hot carrier. These energetic hot carriers will alter their original path and be injected into the oxide layer to become oxide-trapped charges ($N_{ot}$), to drift through the oxide layer and cause leakage current flowing through the gate ($I_G$), to create interface-trapped charges ($D_{it}$), and to generate photons. Both the oxide-trapped charges and the interface-trapped charges cause a threshold voltage shift and mobility degradation. The voltage applied to the gate creates a voltage difference ($V_{ox}$) traverse the oxide layer. An effect frequently observed in electric field stressed oxides is a gate oxide current increase, referred to as stress-induced leakage current (SILC).

The most likely mechanism causing this current increase is trap-assisted tunneling where electrons or holes tunnel from the substrate to the gate through intermediate oxide traps. These traps are generated by the high-field stress and they facilitate electrons or holes tunneling to enhance the current. The intermediate trapped charges comprise not only the previous mentioned oxide-trapped charges and the interface-trapped charges, but also the fixed oxide charges resulting from structural defects and mobile charges generated by sodium (Na), lithium (Li), and potassium (K) ions. Stress-induced leakage current degrades data retention of non-volatile memories, causes problems during the writing and erasing of non-volatile memories and results in reliability issues.

Furthermore, the progress of science and technology has led to continual improvements in the performance of electronic systems and circuits. These improvements have fueled the increased demand for MOS transistors. In a MOS transistor, one of the most basic and critical requirements for proper operation is a stable threshold voltage. If the threshold voltage of a MOS transistor is unstable or out of spec, the turn-on and turn-off of the MOS transistor become abnormal and further affect the accuracy of the operation of an integrated circuit. Therefore, industry develops many methods to accurately judge the quality of oxide. Moreover, the same phenomenon can be found in capacitors and interconnection structures when adequate voltages are applied to one of the electrode plates and an upper layer interconnection, respectively.

Please refer to FIG. 3 and FIG. 4. FIG. 3 and FIG. 4 are resultant diagrams for judging the oxide quality by utilizing a C-V method according to the prior art. The C-V method, if taking an n-channel MOS device formed on a P-type substrate as an example, is to apply a swing time-dependent ramping voltage to the gate, from negative biased voltage to positive biased voltage. Due to the change of the voltage value, the surface of the P-type substrate underneath the gate varies through an accumulation mode, a depletion mode, and an inversion mode. The charge distribution is thus correspondingly changed. As shown in FIG. 3, the total capacitance of a MOS capacitor C is regarded as a series combination of the gate oxide layer capacitance ($C_O$) and the semiconductor depletion-layer capacitance ($C_j$). Since C=dQ/dV, the change of charge distribution results in the change of the MOS capacitor C. By observing the typical C-V curve, the change of charge distribution under different modes is realized and the threshold voltage ($V_T$) for MOS is found.

As shown in FIG. 4, the fixed oxide charges, the mobile charges, the oxide-trapped charges and the interface-trapped charges cause a C-V curve shift. The ideal C-V curve(a) affected by the fixed oxide charges, the mobile charges, and the oxide-trapped charges, is shifted toward left or right to become the C-V curve(b). Since the interface-trapped charges varies with the surface potential of the semiconductor ($._S$), the ideal C-V curve(a), affected by the interface-trapped charges, is not only shifted toward left or right but is also distorted to become the C-V curve(c).

FIG. 5 is a schematic diagram of the charge pumping method for judging the oxide quality according to the prior art. As shown in FIG. 5, if taking an NMOS device 34 formed on a P-type substrate 32 as an example, the charge pumping method is to tie a source 36 and a drain 38 of the NMOS 34 together first. The tied source 36 and the drain 38 are slightly reversed biased with voltage $V_R$. A square-wave pulse train with a specific period is then applied between a gate 42 of the NMOS 34 and the P-type substrate 32. The square-wave pulse voltage is of sufficient amplitude for the channel 44, on a surface of the P-type substrate 32 underneath the gate 42, to be driven into an inversion mode at positive half cycle or an accumulation mode at negative half cycle. The interface traps (not shown) are continuously distributed through the band gap between the valence band and the conductive band.

When the square-wave pulse applied between the gate 42 and the P-type substrate 32 falls from a positive value to a negative value, electrons in the channel 44 during an inversion mode drift to both the source 36 and the drain 38. In addition, electrons captured by those interface traps near the conduction band are thermally emitted into the conduction band and also drift to the source 36 and the drain 38. Electrons captured by those interface traps do not have sufficient time to be thermally emitted and remain captured by the interface traps. Once the hole barrier is reduced, holes that flow to recombine with the electrons captured by those interface traps do not have sufficient time to be thermally emitted. When the square-wave pulse applied between the gate 42 and the P-type substrate 32 returns from the negative value to the positive value, holes captured by those interface traps near the valence band are thermally emitted into the valence band. Holes captured by those interface traps do not have sufficient time to be thermally emitted and remain captured on interface traps until recombining with electrons flowing in from the source 36 and the drain 38.

Hence, those electrons on interface traps within the energy interval .E recombine with the holes. If the electron density (electrons/cm$^2$) flowing into the inversion layer from source/drain is $Q_N/q$, the electron density flowing back into the source/drain is only ($Q_N/q-D_{it}.E$) ($D_{it}$ is interface trapped charge density, unit: cm$^{-2}$.ev$^{-1}$). $D_{it}.E$, the difference, recombine with the holes. Relatively speaking, $D_{it}.E$ more holes flow into the P-type substrate 32 than leave, giving rise to the charge pumping current ($I_{cp}$). A capacitor in parallel with the ammeter for measuring the charge pumping current averages the charge pumping current. Furthermore, if the period of the square-wave pulse is long enough so there is sufficient time for carriers to tunnel into the traps inside the oxide layer, the charge pumping method is utilized to measure the trapped charge density inside the oxide layer 46. The resultant charge-pumping-current versus gate-voltage ($I_{cp},V_g$) curve is shifted from a curve produced by a square-wave pulse of shorter duration, which measures only the interface trapped charge density.

Another prior art method to judge oxide quality is to measure the gate leakage current directly. A specific voltage value is applied to the gate of the non-volatile memory cell, and the gate leakage current is thereafter measured. If the gate leakage current is greater than a predetermined spec, the quality of the oxide layer is not acceptable. If the gate leakage current is less than the predetermined spec, the quality of the oxide layer is okay.

However, the prior art methods for judging the quality of the oxide layer all have limitations regardless of which method is used, the C-V method, the charge pumping method or to directly measure the gate leakage current. When compared with other methods, the C-V method requires a MOS capacitor with larger area, is feasible only when the charge quantity is larger than a specific value, and adds to measuring difficulties by using a more complicated equation. In addition, the C-V method cannot be applied to a production line because the wafer acceptance testing equipment cannot measure capacitance. The strength of the charge pumping method includes being applicable to small-geometry MOS devices and to obtain the direct measurement of the charge pumping current that is proportional to interface-trapped charge density. However, an AC pulse generator is required to supply the gate voltage and a single value for an average interface trapped charge density is obtained, rather than the energy distribution of the interface trapped charge density.

Though the method to directly measure the gate leakage current is quite simple, the information obtained is very limited. A cycling test is necessary if attempts are made to observe the change of the memory cell. In other words, the steps of writing, erasing, and measuring are repeated many times with consuming a large amount of time. In addition, the quality of the insulation layers in other devices or structures, such as capacitors, interconnection structures, etc., also need to be monitored. It is therefore very important to develop a new method to overcome the above mentioned problems and to be applied to the production line.

SUMMARY OF INVENTION

It is therefore a primary objective of the claimed invention to provide a method for monitoring the quality of an insulation layer, and more particularly, to a method for quickly monitoring the quality of an insulation layer in a device or a structure by measuring the stress-induced leakage current (SILC) with wafer acceptance testing (WAT) equipment.

According to the claimed invention, a method for fast monitoring the stress-induced degradation of an insulation layer in a capacitor by a wafer acceptance testing equipment is provided. The method comprises to provide a substrate first. A surface of the substrate comprises a first conductive layer, a second conductive layer, and the insulation layer disposed between the first conductive layer and the second conductive layer.

A first voltage is thereafter applied to the first conductive layer. The first voltage is a swing time-dependent DC ramping voltage. After that, a first leakage current flowing through the first conductive layer is measured and a first proportional value is calculated from an equation. A second voltage is then applied to the first conductive layer. The second voltage is a swing time-dependent DC ramping voltage. Next, a second leakage current flowing through the first conductive layer is measured and a second proportional value is calculated from the equation. A first ratio of the second proportional value to the first proportional value is calculated. Finally, a comparing step is performed to compare a value of the first ratio with a predetermined value.

It is an advantage of the claimed invention to examine the insulation layer quality in a flash ROM cell, a MOS transistor, a capacitor, or an interconnection structure with a simple, fast, and automated in-line monitor by utilizing the wafer acceptance testing equipment in a clean room and a β-voltage curve. The claimed invention method is very sensitive to the intermediate charges trapped inside the insulation layer and at the interface of the insulation layer and other materials and reflects the real-time change. A swing time-dependent DC ramping voltage is utilized to do the test, which exerts continuous stress fields to the insulation layer. The stress-induced leakage current (SILC) is therefore more readily produced to accurately simulate device failure when compared with the methods adopting single voltage value.

These and other objectives of the present invention will no doubt become obvious to those of ordinary skill in the art after reading the following detailed description of the preferred embodiment that is illustrated in the various figures and drawings.

DETAILED DESCRIPTION

The principle for monitoring the quality of the insulation layer according to the present invention is to utilize the Fowler-Nordheim tunneling mechanism equation. That means, the method provided by the present invention may be applied to any of the insulation layers in which the Fowler-Nordheim tunneling occur. The insulation layer may be a tunnel oxide layer in a flash memory cell or other non-volatile memory cells, a gate oxide layer in a MOS transistor, a capacitor dielectric layer in a capacitor, or an inter layer dielectric in a interconnection structure. For example, a gate current ($I_g$) is due to Fowler-Nordheim tunneling when the voltage difference across the oxide layer for the $SiO_2$—Si interface is greater than approximately 3.2V. However, since both the insulation layer and the material layer directly contacting with the insulation layer may have different material compositions, different interfaces are thus formed. The voltage difference across the insulation layer, required for Fowler-Nordheim tunneling, is variable depending on different situation.

Figure 1:
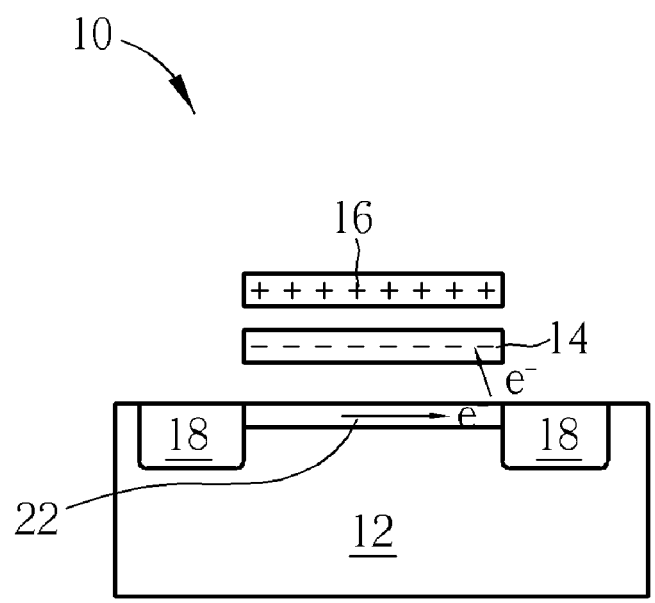
FIG. 1 and FIG. 2 are schematic diagrams of writing and erasing a flash ROM cell.
Figure 2:
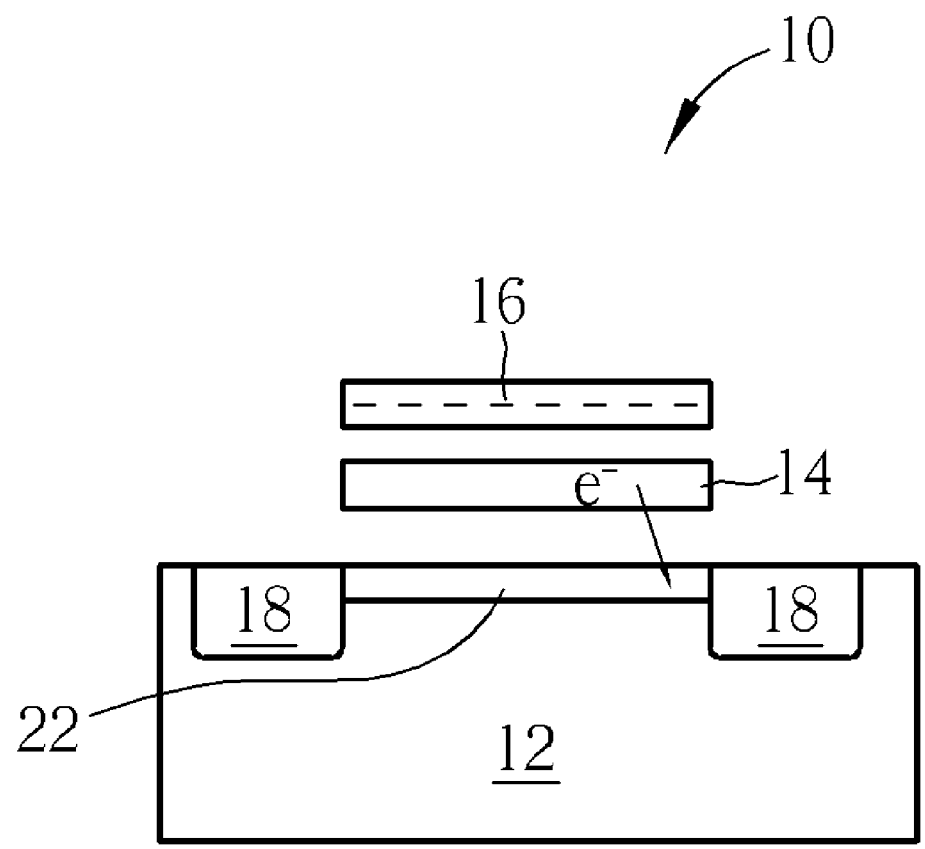
Figure 3:
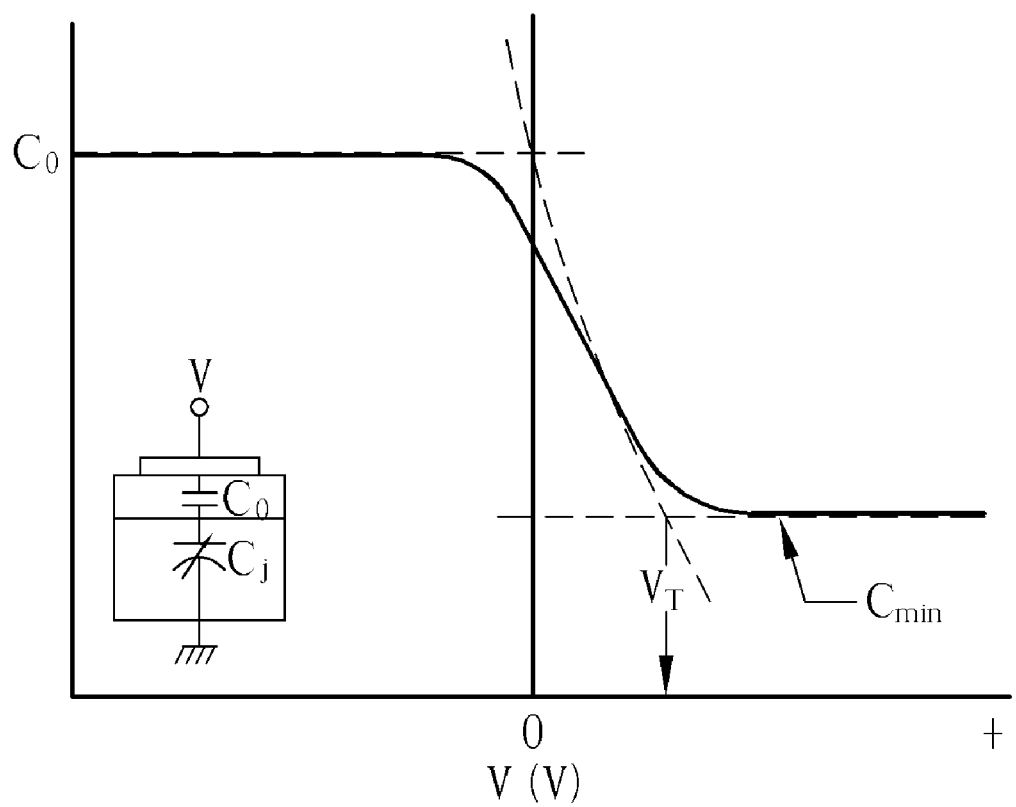
FIG. 3 and FIG. 4 are resultant diagrams for judging the oxide quality by utilizing a C-V method according to the prior art.
Figure 4:
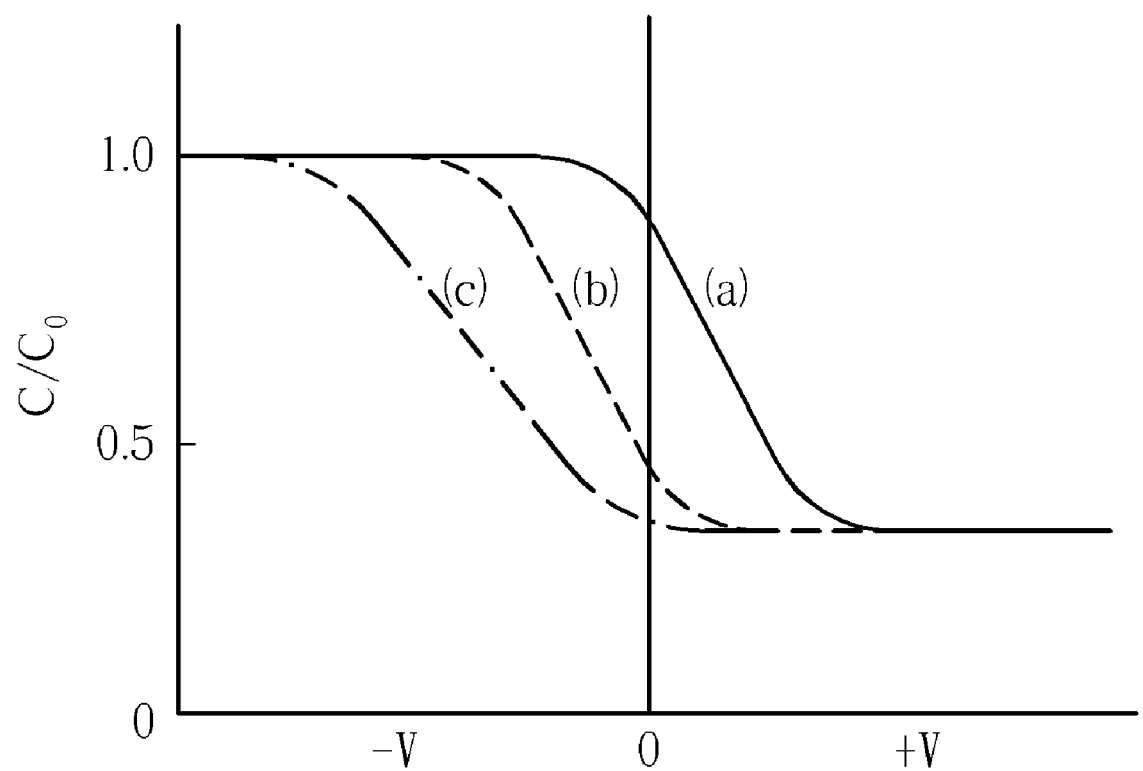
Figure 5:
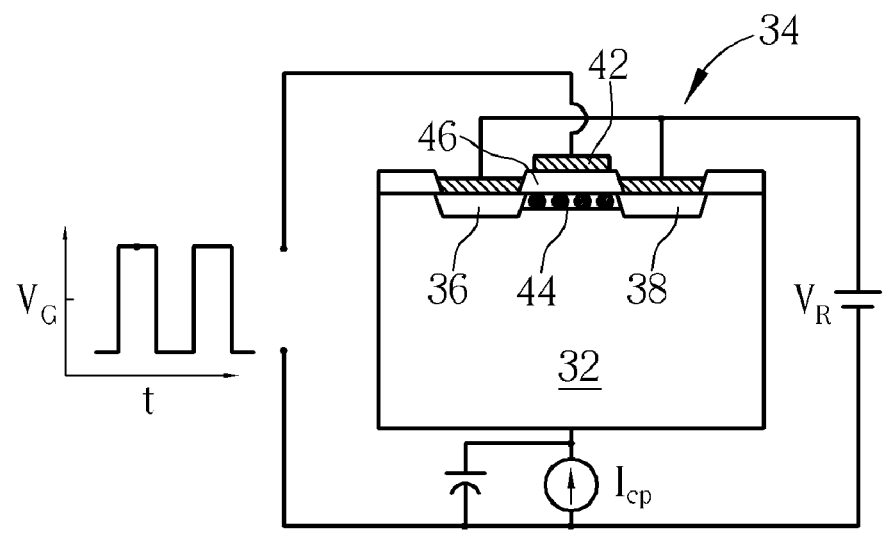
FIG. 5 is a schematic diagram of a charge pumping method for judging the oxide quality according to the prior art.
Figure 5:
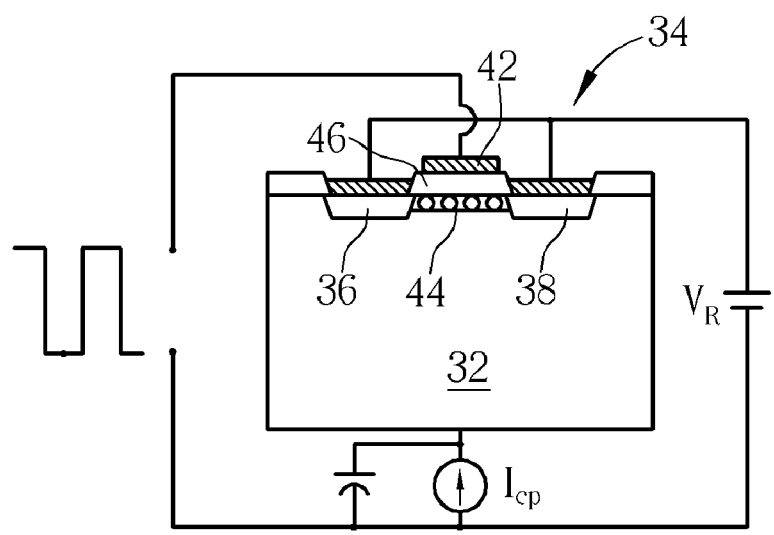
Figure 6:
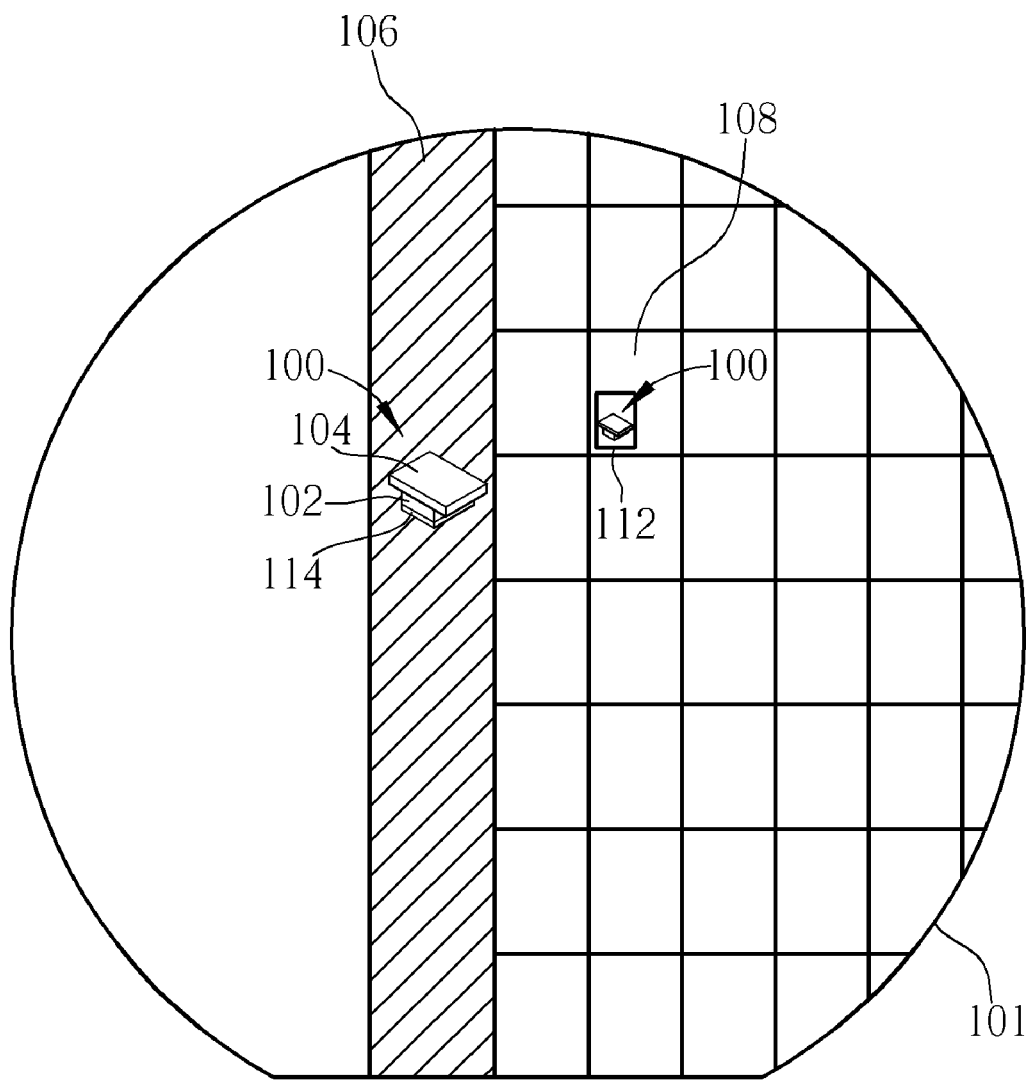
FIG. 6 is a schematic diagram of a method for monitoring the quality of an oxide layer in a flash ROM cell according to a first preferred embodiment of the present invention.
Figure 7:
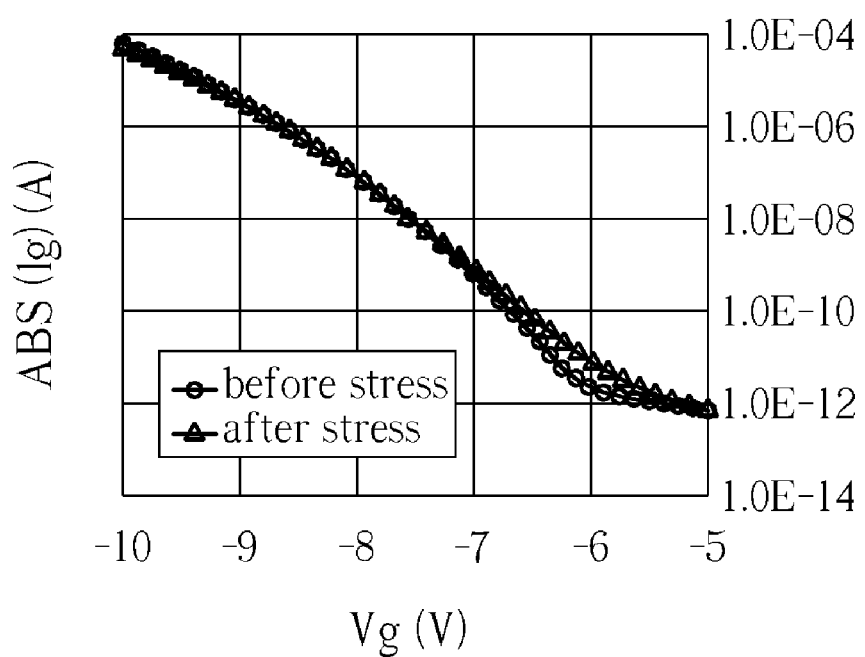
FIG. 7 is a gate current-gate voltage curve according to the first preferred embodiment of the present invention.
Figure 8:
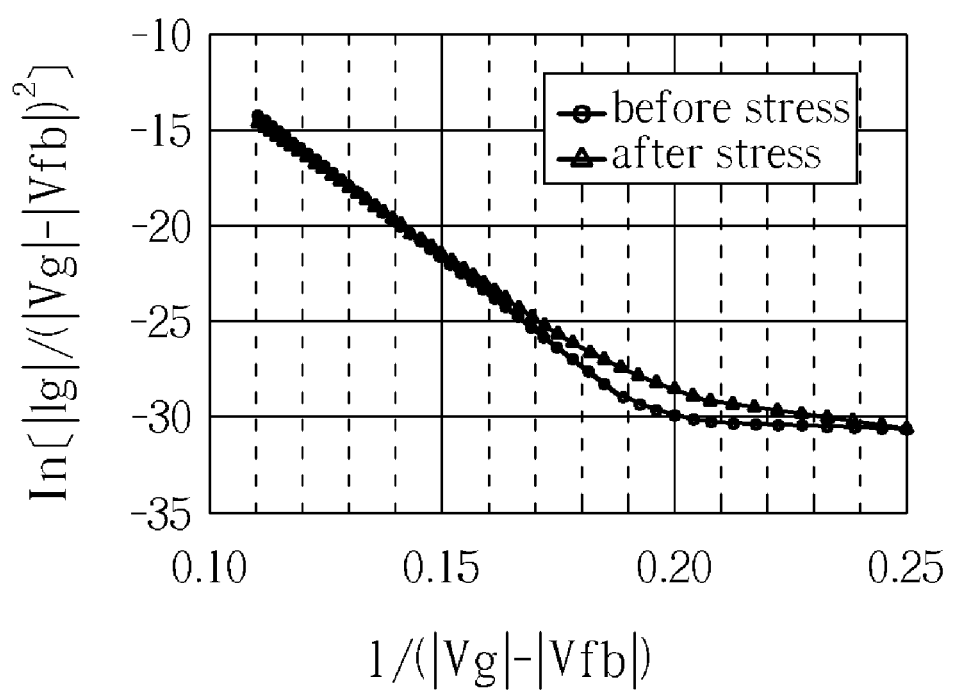
FIG. 8 is a curve for extracting β values according to the first preferred embodiment of the present invention.
Figure 9:
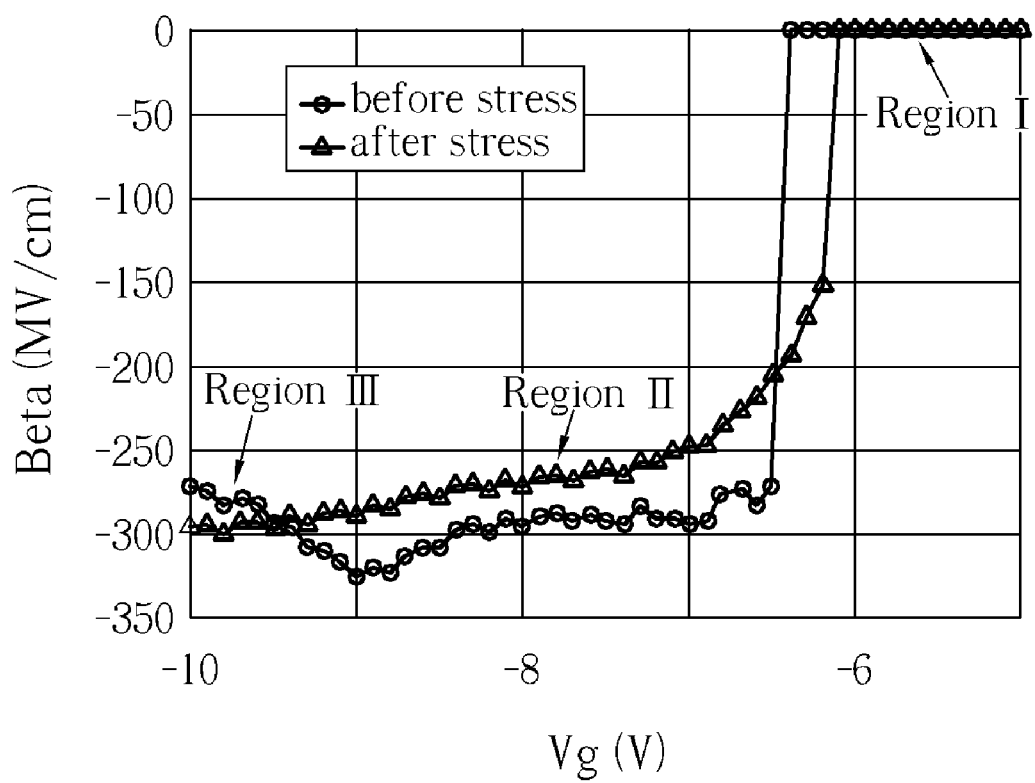
FIG. 9 is an extracted β value-gate voltage curve according to the first preferred embodiment of the present invention.
Figure 10:
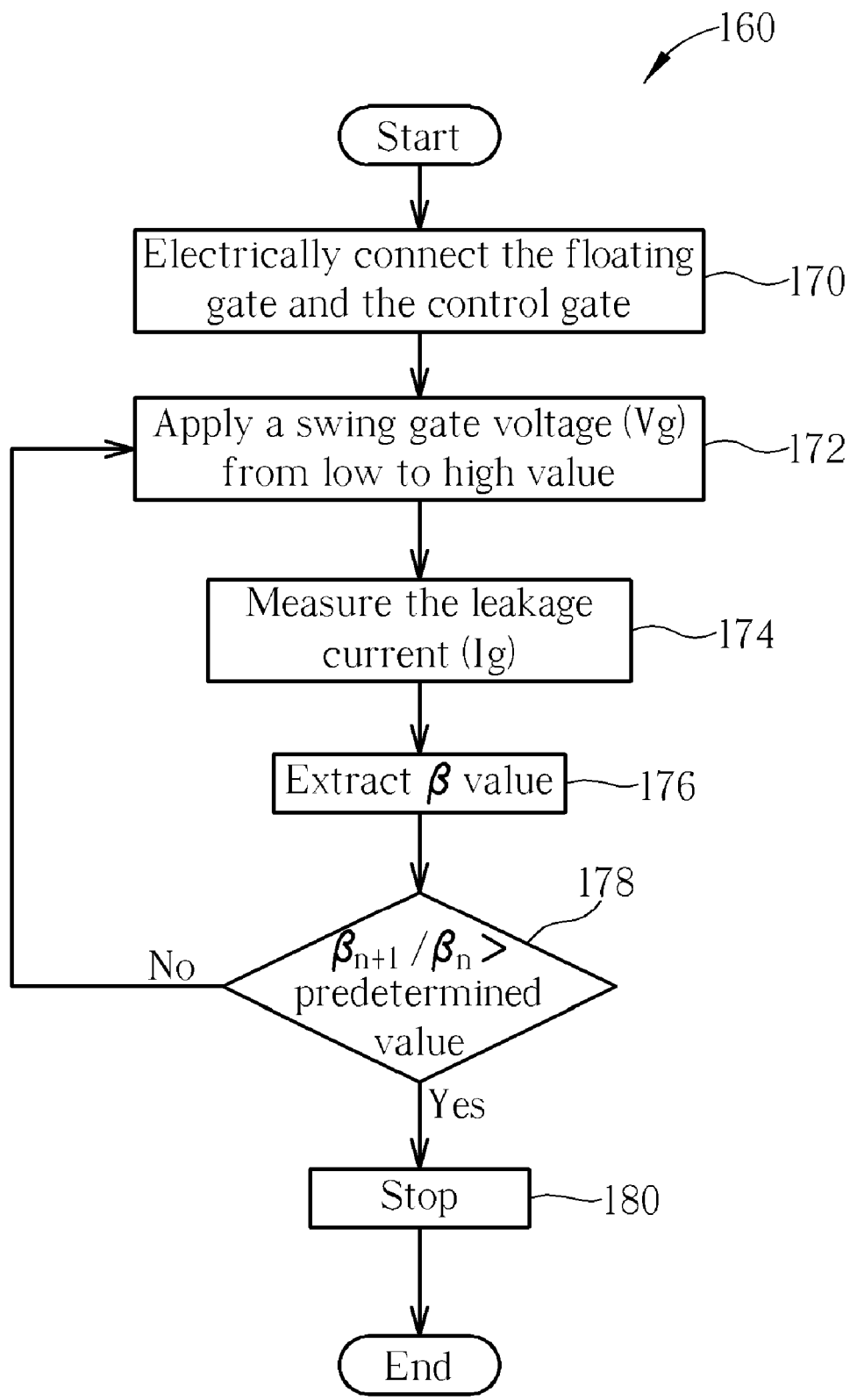
FIG. 10 is a flowchart of a method for monitoring oxide quality by utilizing wafer acceptance testing equipment to extract β values.

Please refer to FIG. 6 to FIG. 10, FIG. 6 is a schematic diagram of a method for monitoring the quality of an oxide layer in a flash ROM cell 100 according to a first preferred embodiment of the present invention. FIG. 7 is a gate current-gate voltage curve according to the first preferred embodiment of the present invention. FIG. 8 is a curve for extracting β values according to the first preferred embodiment of the present invention. FIG. 9 is an extracted β value-gate voltage curve according to the first preferred embodiment of the present invention. FIG. 10 is a flowchart 160 of a method for monitoring oxide quality by utilizing wafer acceptance testing equipment to extract β values.

As shown in FIG. 6, an n-channel flash ROM cell 100 formed on a P-type substrate 101 is taken as an example in the first preferred embodiment of the present invention. First, a floating gate 102 is electrically connected (step 170) to a control gate 104 of the flash ROM cell 100. The method to electrically connect the floating gate 102 and the control gate 104 is to form the floating gate 102 and the control gate 104 in a testing area 106 on the P-type substrate 101, or to form the floating gate 102 and the control gate 104 on a test key 112 in a memory chip 108 on the P-type substrate 101. There is not any dielectric layer formed between the floating gate 102 and the control gate 104, and an oxide layer (here, a tunnel oxide layer) 114 is simultaneously formed between the floating gate 102 and the P-type substrate 101 when normal products are formed. The floating gate 102 and the control gate 104 are therefore successfully electrically connected without affecting the normal product area.

Then wafer acceptance testing equipment in a production line is utilized to apply a first gate voltage, which is one of the swing time-dependent negative DC ramping voltage, to the floating gate 102 and the control gate 104 (step 172). A first gate leakage current flowing through the floating gate 102 and the control gate 104 of the flash ROM cell 100 is thereafter measured (step 174). The gate leakage current is given by the Fowler-Nordheim tunneling mechanism equation:

$$I_g = \alpha E_{ox}^2 \exp(-\beta/E_{ox})$$

where $E_{ox}$ denotes the oxide electric field strength, and α and β denotes two constants.

When the voltage value applied to the floating gate 102 and the control gate 104 is negative, a surface of the P-type substrate 101 underneath the gate is in an accumulation mode. The oxide electric field strength is given by equation (1):

$$E_{OX} = (|V_g| - |V_{fb}|)/T_{OX} \qquad \text{(Equation 1)}$$

where $V_{fb}$ donates the flatband voltage, and $T_{ox}$ denotes the thickness of oxide layer.

By substituting the $E_{ox}$ in equation (1) into the Fowler-Nordheim tunneling mechanism equation, a new equation is obtained. The new equation is called as equation (2) so as to facilitate the discription:

$$\ln[I_g I/(|V_g I - |V_{fb}|)^2] = \ln(\alpha/t_{OX}^2) - \beta t_{ox}/(|V_g I - |V_{fb}|) \qquad \text{(Equation 2)}$$

After that, a production line wafer acceptance testing equipment is utilized to apply a second gate voltage that is one of the swing time-dependent negative DC ramping voltages to the floating gate 102 and the control gate 104 (step 172). The absolute value of the second gate voltage is greater than the absolute value of the first gate voltage. A second gate leakage current flowing through the floating gate 102 and the control gate 104 of the flash ROM cell 100 is then measured (step 174). By repeating the two steps (step 172 and step 174), the gate current-gate voltage curve ($I_g$–$V_g$ curve) shown in FIG. 7 is plotted. As shown in FIG. 7, a reference gate current-gate voltage curve (reference $I_g$–$V_g$ curve), representing the gate current-gate voltage curve for the oxide layer 114 in the flash ROM cell 100 that is not electric field stressed, is used for comparing with the measured gate current-gate voltage curve. In FIG. 7, it is not difficult to find that the measured gate current increases slightly in comparison with the reference curve when the value of the gate voltage is greater than −7 volts.

Almost at the same time when the curve in FIG. 7 is obtained, FIG. 8's results can be found by inputting equation (2) and parameters, such as the flatband voltage ($V_{fb}$) and the thickness of oxide layer ($T_{ox}$), into the wafer acceptance testing equipment. FIG. 8 is a curve for extracting β values according to the present invention. The axis of an ordinate represents the value of $\ln [I_g I/(|V_g I - |V_{fb}|)^2]$, the axis of an abscissa represents the value of $1/(|V_g I - |V_{fb}|)$, and the slope for each point is equal to $-\beta T_{ox}$. By executing a step to extract a β value (step 176), an extracted β value-corresponding gate voltage curve as FIG. 9 is plotted. Owning to the continuously applied swing time-dependent negative DC ramping voltage, the oxide layer 114 is stressed. The intermediate trapped charges are thus generated gradually inside the oxide layer 114 and at the interface of the oxide layer 114 and the P-type substrate 101. Stress-induced leakage current (SILC) is thus resulted in.

Three different regions are clearly observed in the curve in FIG. 9. Within the first region (region I), the β values are zero to represent each gate leakage current is less than $1.0 \times 10^{-11}$ A. While the absolute values of the β values within the second region (region II) start to increase, an obvious increase of the stress-induced leakage current is shown. Within the third region (region III), where a more negative voltage is applied to the gate, the absolute values of the β values increase more obviously (while the absolute values of the β values within the third region are greater than the absolute values of the β values within the second region), with the β values even crossing the none electric field stressed β value-gate voltage curve and represents carriers trapped and the intermediate trapped charges.

Almost at the same time when the results in FIG. 9 are found, a comparison step is performed. A ratio is obtained by dividing the β value with the previous β value. For example, the β value corresponding to the second gate voltage is divided by the β value corresponding to the first gate voltage. The ratio is then compared with a predetermined value (step 178). The magnitude of the predetermined value is dependent on the spec for each product, and the predetermined value for the present invention flash ROM cell is 10. If the ratio is greater than the predetermined value, the quality of the oxide layer 114 is out of spec and a stop step (step 180) is performed. If the ratio is smaller than the predetermined value, step 172 is performed.

As shown in FIG. 10, the flowchart 160 of a method for monitoring oxide quality by utilizing wafer acceptance testing equipment to extract β values according to the present invention comprises the following steps:

Step 170: Electrically connect the floating gate and the control gate of the flash ROM cell;

Step 172: Apply a swing time-dependent negative DC ramping voltage, from low to high value, to the floating gate and the control gate;

Step 174: Measure the leakage current flowing through the floating gate and the control gate of the flash ROM cell;

Step 176: Executing a β value extracting step;

Step 178: Perform a comparing step, if the ratio is greater than the predetermined value, go to step 180; if the ratio is smaller than the predetermined value, go to step 172; and Step 180: Perform a stop step.

Figure 11:
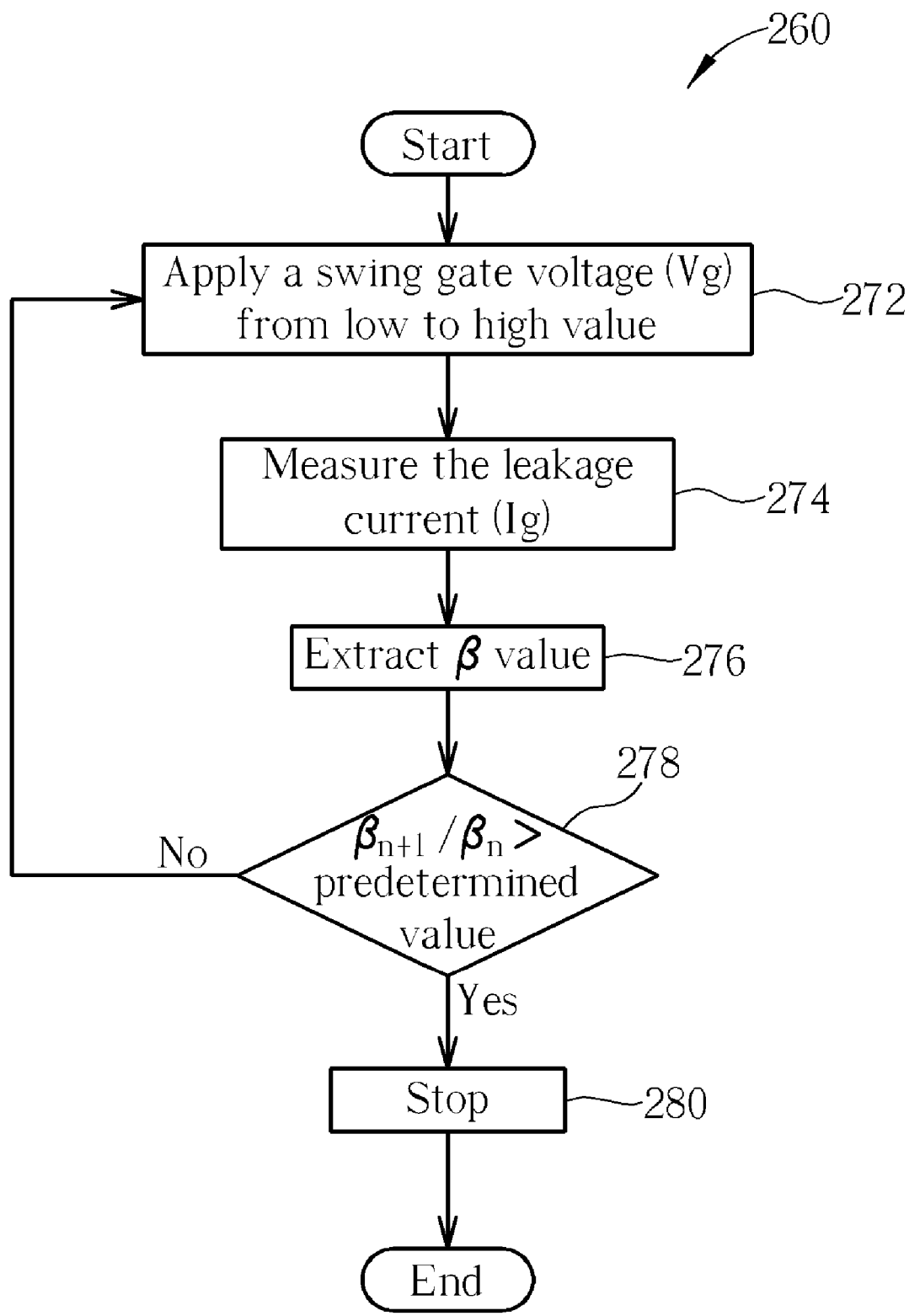
FIG. 11 is a flowchart of a method for monitoring gate oxide quality by utilizing wafer acceptance testing equipment to extract β values according to a second preferred embodiment of the present invention.

The present invention method can also be applied to a MOS transistor. Please refer to FIG. 11, FIG. 11 is a flowchart 260 of a method for monitoring gate oxide quality by utilizing wafer acceptance testing equipment to extract β values according to a second preferred embodiment of the present invention. When monitoring the quality of a gate oxide layer in a MOS transistor, the step of electrically connecting the floating gate and the control gate (please refer to step 170 in FIG. 10) is omitted since the MOS transistor is a single gate device. Other steps, including steps 272, 274, 276, 278, and 280, are the same as the steps 172, 174, 176, 178, and 180 for monitoring the oxide layer in the flash ROM cell and shown in FIG. 10. It is worth noting that the gate oxide layer is only one kind of a gate insulating layer. The gate insulating layer may be a silicon nitride layer, an oxygen-contained layer having a dielectric constant between 2.0 and 7.0, or other insulation layer. In addition, the MOS transistor may be formed in a testing area (not shown) on a substrate (not shown), or may be formed on a test key (not shown) in other areas (not shown) on a substrate (not shown).

Figure 12:
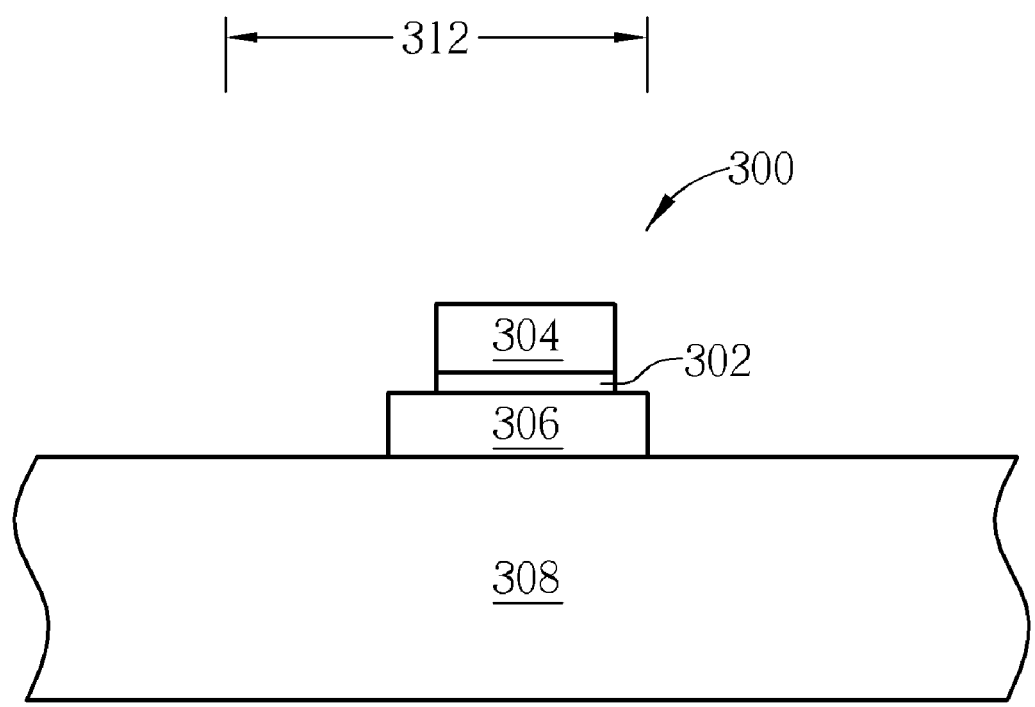
FIG. 12 is a schematic diagram of a method for monitoring the quality of an insulation layer in a capacitor according to a third preferred embodiment of the present invention.
Figure 13:
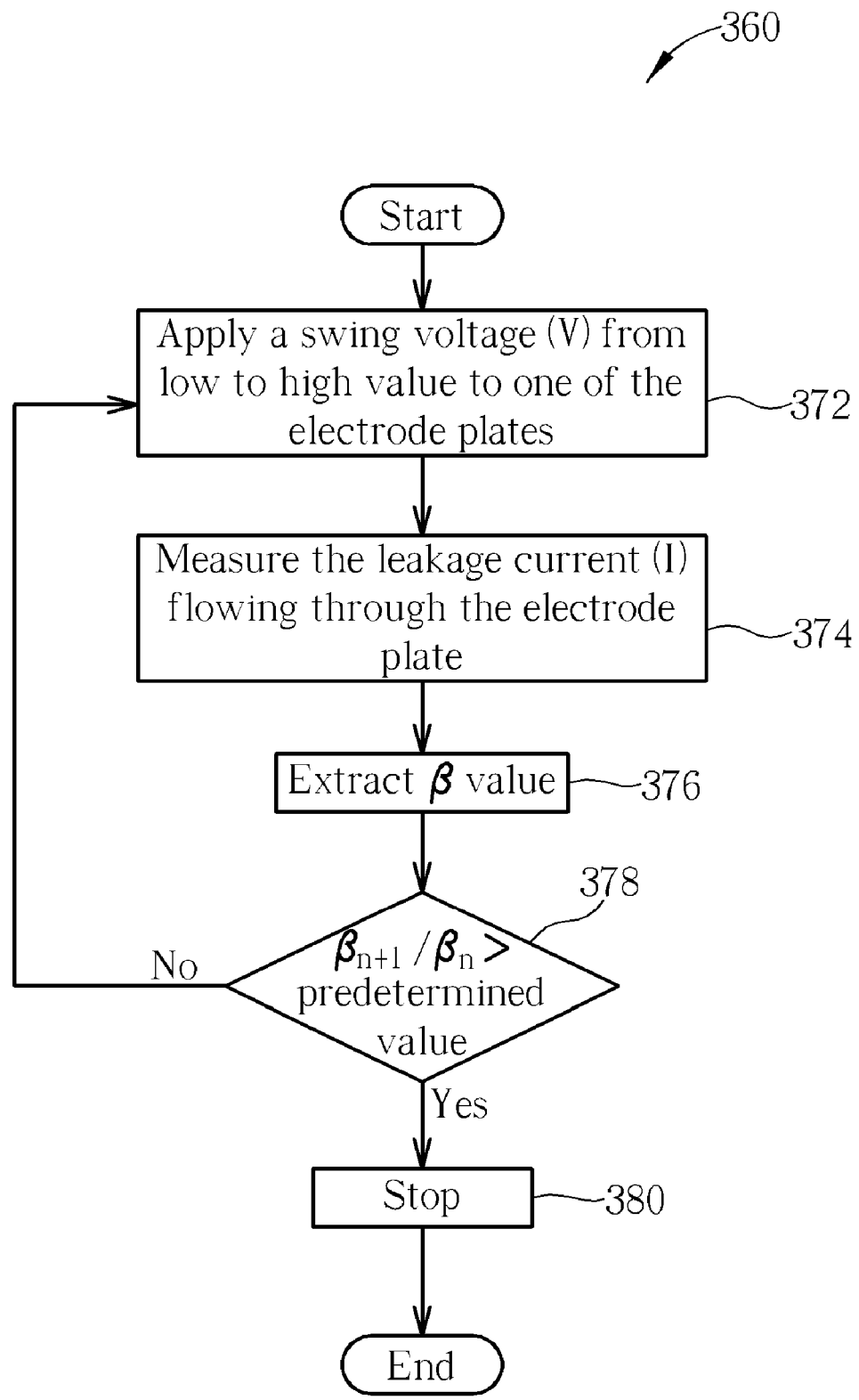
FIG. 13 is a flowchart of the method for monitoring the quality of the insulation layer in the capacitor by utilizing wafer acceptance testing equipment to extract β values according to the third preferred embodiment of the present invention.

The present invention method can also be applied to an insulation layer in a capacitor. Please refer to FIG. 12 and FIG. 13, FIG. 12 is a schematic diagram of a method for monitoring the quality of an insulation layer 302 in a capacitor 300 according to a third preferred embodiment of the present invention. FIG. 13 is a flowchart 360 of the method for monitoring the quality of the insulation layer in the capacitor by utilizing wafer acceptance testing equipment to extract β values according to the third preferred embodiment of the present invention. As shown in FIGS. 12 and 13, the wafer acceptance testing equipment in a production line is utilized to apply a first voltage, which is one of the swing time-dependent negative DC ramping voltages, to one of the electrode plates 304, 306, when monitoring the quality of the insulation layer 302 in the capacitor 300 (step 372). If the electrode plate 304 is a top electrode plate of the capacitor 300, the electrode plate 306 is a bottom electrode plate of the capacitor 300. If the electrode plate 304 is a bottom electrode plate of the capacitor 300, the electrode plate 306 is a top electrode plate of the capacitor 300. No matter what is the situation, the insulation layer 302 is a capacitor dielectric layer of the capacitor 300. Here, the first voltage is applied to the electrode plate 304. A first leakage current flowing through the electrode plate 304 is thereafter measured (step 374).

Then, the production line wafer acceptance testing equipment is utilized to apply a second voltage that is one of the swing time-dependent negative DC ramping voltages to the electrode plate 304 (step 372). The absolute value of the second voltage is greater than the absolute value of the first voltage. A second leakage current flowing through the electrode plate 304 is then measured (step 374). By repeating the two steps (step 372 and step 374), a current-voltage curve (I-V curve, not shown) similar to the gate current-gate voltage curve shown in FIG. 7 is plotted.

After that, a step 376 is executed to extract a β value, and a comparing step (step 378) is performed to obtain a ratio by dividing the β value with the previous β value. The ratio is then compared with a predetermined value (step 378). It is worth noting that the material composition of the top electrode plate, the capacitor dielectric layer, and the bottom electrode plate vary depending on practical requirement. Different interfaces are thus formed. The material composition of both the electrode plates 304, 306 comprise metal, polysilicon, or other conductive materials. The insulation layer 302 may be a silicon oxide layer, a silicon nitride layer, or a silicon oxynitride layer. In addition, the insulation layer 302 may be an oxygen-contained thin film, and a weight percent of oxygen in the oxygen-contained thin film is smaller than 60%. Moreover, the insulation layer 302 may be a low-k material layer, and the material composition of the low-k material layer comprises at least two elements selected from a group consisting Si, C, H, O, N, and F, where a weight percent of oxygen in the low-k material layer is between 0 and 60%.

In FIG. 12, the capacitor 300 is formed on a semiconductor substrate 308. However, the same method can be applied to a capacitor that utilizes the semiconductor substrate 308 as one of the electrode plates. Furthermore, the capacitor 300 is formed in a testing area 312 on the semiconductor substrate 308 in FIG. 12. However, the capacitor 300 may be formed on a test key (not shown) in other areas (not shown) on the semiconductor substrate 308.

Therefore, the magnitude of the predetermined value is dependent on the practical situation (eg. the interface). If the ratio is greater than the predetermined value, the quality of the insulation layer 302 is out of spec and a stop step (step 380) is performed. If the ratio is smaller than the predetermined value, step 372 is performed. Actually, steps 376, 378, 380 are the same as steps 176, 178, 180 in FIG. 10. Owning to the continuously applied swing time-dependent negative DC ramping voltage, the insulation layer 302 is stressed. The intermediate trapped charges are thus generated gradually inside the insulation layer 302 and at the interface of the insulation layer 302 and the electrode plate 306. Stress-induced leakage current is thus resulted in.

Figure 14:
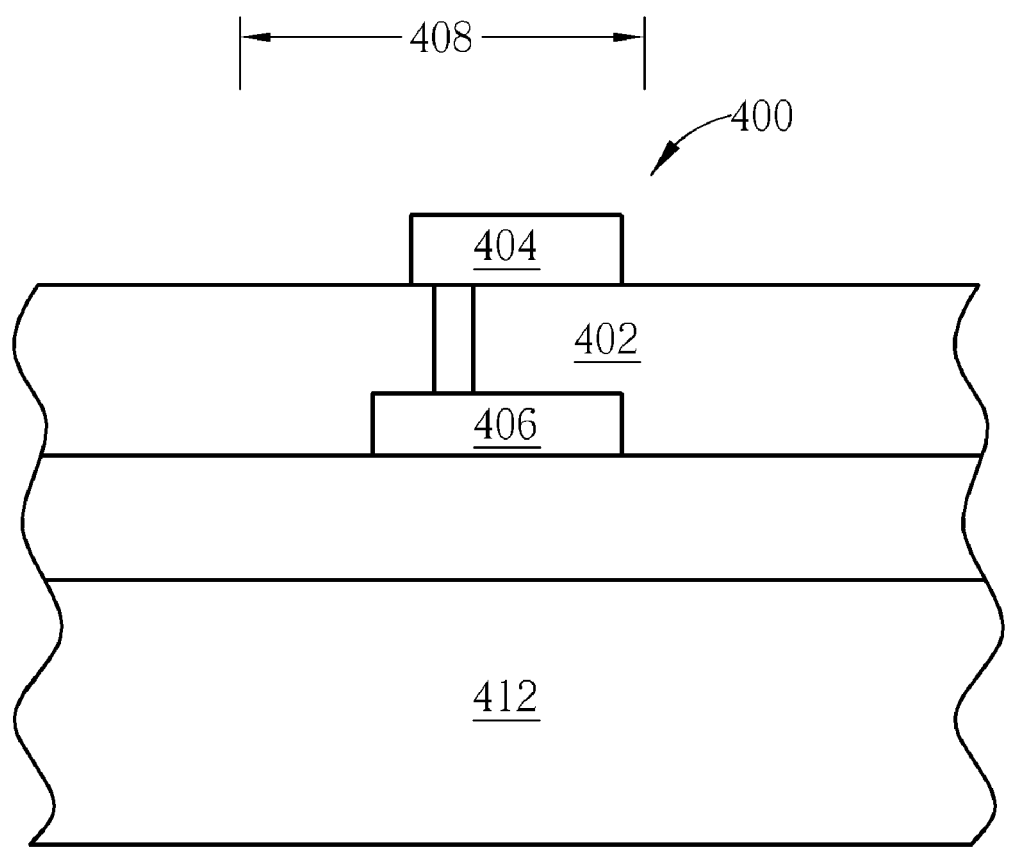
FIG. 14 is a schematic diagram of a method for monitoring the quality of an inter layer dielectric in an interconnection structure according to a fourth preferred embodiment of the present invention.
Figure 15:
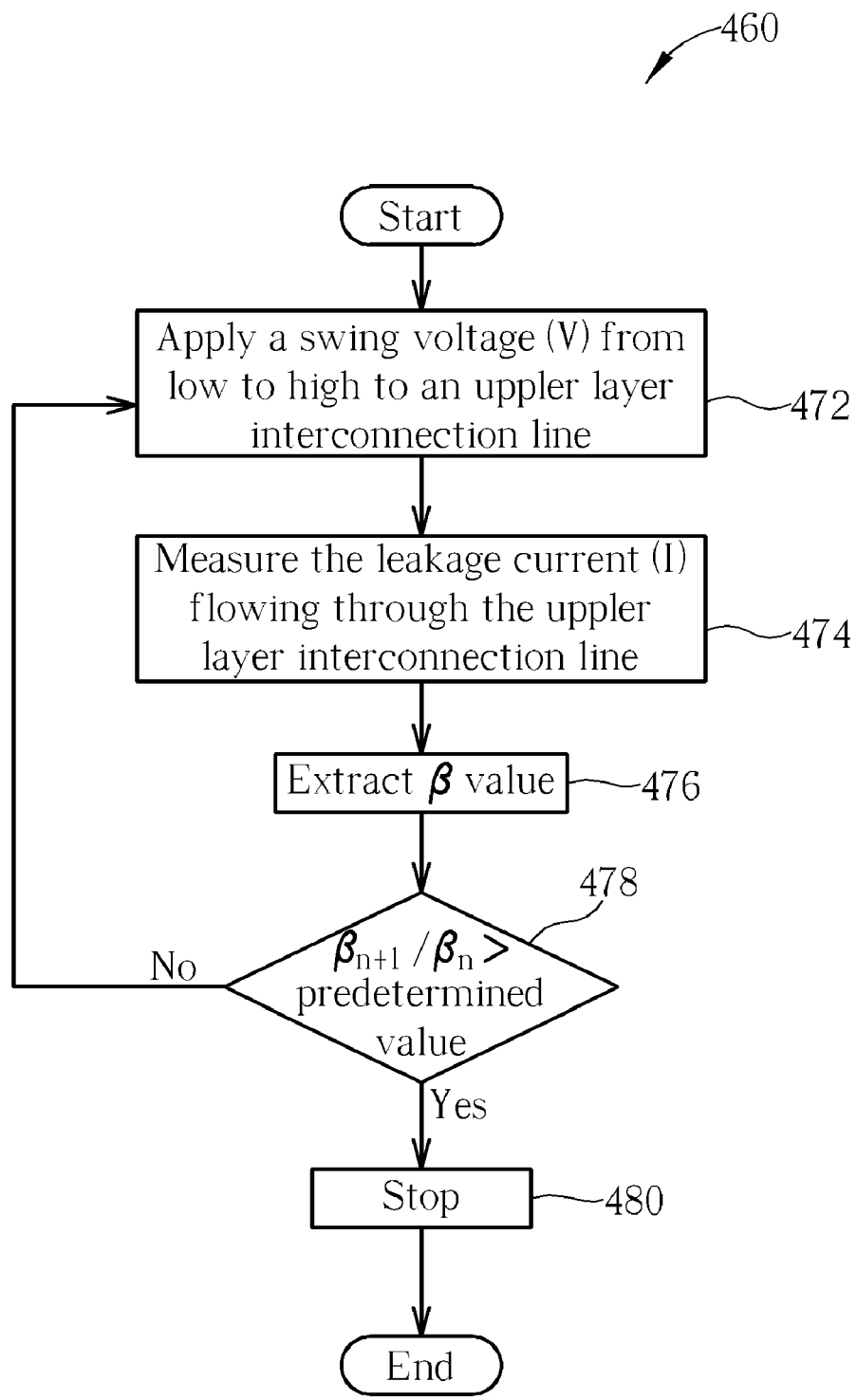
FIG. 15 is a flowchart of the method for monitoring the quality of the inter layer dielectric in the interconnection structure by utilizing wafer acceptance testing equipment to extract β values according to the fourth preferred embodiment of the present invention.

The present invention method can also be applied to an interconnection structure. Please refer to FIGS. 14 and 15, FIG. 14 is a schematic diagram of a method for monitoring the quality of an inter layer dielectric 402 in an interconnection structure 400 according to a fourth preferred embodiment of the present invention. FIG. 15 is a flowchart 460 of the method for monitoring the quality of the inter layer dielectric in the interconnection structure by utilizing wafer acceptance testing equipment to extract β values according to the fourth preferred embodiment of the present invention. As shown in FIG. 14 and FIG. 15, a wafer acceptance testing equipment in a production line is utilized to apply a first voltage, which is one of the swing time-dependent negative DC ramping voltages, to an upper layer interconnection line 404 (step 472). A first leakage current flowing through the upper layer interconnection line 404 is thereafter measured (step 474).

Then, the production line wafer acceptance testing equipment is utilized to apply a second voltage that is one of the swing time-dependent negative DC ramping voltages to the upper layer interconnection line 404 (step 472). The absolute value of the second voltage is greater than the absolute value of the first voltage. A second leakage current flowing through the upper layer interconnection line 404 is then measured (step 474). By repeating the two steps (step 472 and step 474), a current-voltage curve (I-V curve, not shown) similar to the gate current-gate voltage curve shown in FIG. 7 is plotted.

After that, a step 476 is executed to extract a β value, and a comparing step (step 478) is performed to obtain a ratio by dividing the β value with the previous β value. The ratio is then compared with a predetermined value (step 478). It is worth noting that the material composition of the upper layer interconnection line 404, the inter layer dielectric 402, and the lower layer interconnection line 406 vary depending on practical requirements. Different interfaces are thus formed. The material composition of both the upper layer interconnection line 404 and the lower layer interconnection line 406 comprise aluminum, copper, or other conductive materials. The inter layer dielectric 402 may be a silicon oxide layer, a silicon nitride layer, or a silicon oxynitride layer. In addition, the inter layer dielectric 402 may be an oxygen-contained thin film, and a weight percent of oxygen in the oxygen-contained thin film is smaller than 60%. Moreover, the inter layer dielectric 402 is a low-k material layer, and the material composition of the low-k material layer comprises at least two elements selected from a group consisting Si, C, H, O, N, and F, where a weight percent of oxygen in the low-k material layer is between 0 and 60%.

Therefore, the magnitude of the predetermined value depends on the practical situation (eg. the interface). If the ratio is greater than the predetermined value, the quality of the inter layer dielectric 402 is out of spec and a stop step (step 480) is performed. If the ratio is smaller than the predetermined value, step 472 is performed. Actually, steps 476, 478, 480 are the same as steps 176, 178, 180 in FIG. 10. Owning to the continuously applied swing time-dependent negative DC ramping voltage, the inter layer dielectric 402 is stressed. The intermediate trapped charges are thus generated gradually inside the inter layer dielectric 402 and at the interface of the inter layer dielectric 402 and the lower layer interconnection line 406. Stress-induced leakage current is thus resulted in. It is worth noting that the interconnection structure 400 is formed in a testing area 408 on a semiconductor substrate 412 in FIG. 14. However, the interconnection structure 400 may be formed on a test key (not shown) in other areas (not shown) on the semiconductor substrate 412.

The present invention method for monitoring the insulation layer quality in the flash ROM cell, the MOS transistor, the capacitor, and the interconnection structure is to simply and quickly monitor the intermediate trapped charges in the insulation layer and at the interface of the insulation layer and other materials by using the wafer acceptance testing equipment in a clean room and the β-voltage curve. The present invention method is very sensitive to the generated intermediate trapped charges, and reflects the actual situation rapidly. In addition, the present invention method utilizes a swing time-dependent DC ramping voltage, which exerts continuous stress fields to the insulation layer. Hence, the stress-induced leakage current (SILC) more readily occurs to accurately simulate device failure when compared with the methods adopting a single voltage value.

In contrast to the prior art method for monitoring the oxide layer quality in the flash ROM cell and in the MOS transistor, the present invention method for monitoring the insulation layer quality in the memory cell, the MOS transistor, the capacitor, the interconnection structure is to utilize the wafer acceptance testing equipment in a clean room and the β-voltage curve to do in-line monitoring. The stress of the present invention method is simple, fast, and readily automated. In addition, the present invention is very sensitive to the intermediate trapped charges inside the insulation layer and at the interface of the insulation layer and other materials so that a real-time change is reflected. Because a swing time-dependent DC ramping voltage, which exerts continuous stress fields to the insulation layer is utilized to do the test, the stress-induced leakage current (SILC) more readily occurs when compared with the methods adopting a single voltage value, accurately simulating device failure without spending a lot of time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fast monitoring the stress-induced degradation of an insulation layer in a capacitor by a wafer acceptance testing (WAT) equipment, the method comprising:
    (a) providing a substrate, a surface of the substrate comprising a first conductive layer, a second conductive layer, and the insulation layer disposed between the first conductive layer and the second conductive layer;
    (b) applying a first voltage to the first conductive layer, the first voltage being a swing time-dependent DC ramping voltage;
    (c) measuring a first leakage current flowing through the first conductive layer to calculate a first proportional value from the first voltage, the first leakage current, and an equation, the first proportional value corresponding to the first voltage;
    (d) applying a second voltage to the first conductive layer, the second voltage being a swing time-dependent DC ramping voltage;
    (e) measuring a second leakage current flowing through the first conductive layer to calculate a second proportional value from the second voltage, the second leakage current, and the equation, the second proportional value corresponding to the second voltage; and
    (f) calculating a first ratio of the second proportional value to the first proportional value.

2. The method of claim 1 wherein the substrate is a silicon substrate of a semiconductor wafer.

3. The method of claim 2 wherein the first conductive layer is a top electrode plate of the capacitor, the second conductive layer is a bottom electrode plate of the capacitor, and the capacitor is formed in a testing area of the semiconductor wafer.

4. The method of claim 2 wherein the first conductive layer is a bottom electrode plate of the capacitor, the second conductive layer is a top electrode plate of the capacitor, and the capacitor is formed in a testing area of the semiconductor wafer.

5. The method of claim 1 wherein the material composition of both the first conductive layer and the second conductive layer comprise metal, polysilicon, or other conductive materials.

6. The method of claim 1 wherein the material composition of the insulation layer comprises silicon oxide, silicon nitride, or silicon oxynitride.

7. The method of claim 1 wherein the insulation layer is an oxygen-contained thin film, and a weight percent of oxygen in the oxygen-contained thin film is smaller than 60%.

8. The method of claim 1 wherein the insulation layer is a low-k material layer, and the material composition of the low-k material layer comprises at least two elements selected from a group consisting Si, C, H, O, N, and F, where a weight percent of oxygen in the low-k material layer is between 0 and 60%.

9. The method of claim 1 further comprising a comparing step to compare the value of the first ratio with a predetermined value.

10. The method of claim 9 wherein each proportional value is a β value corresponding to each voltage respectively.

11. The method of claim 10 wherein the first proportional value is a β1 value corresponding to the first voltage and the β1 value is equal to $$\{\Delta \ln[|\text{the first leakage current}|/(|\text{the first voltage}|-|\text{flat band voltage}(V_{fb})|)^2]\} \div \{\Delta[1 \div (|\text{the first voltage}|-|\text{the flatband voltage}|)]\}.$$

12. The method of claim 10 wherein the second proportional value is a β2 value corresponding to the second voltage and the β2 value is equal to $$\{\Delta \ln[|\text{the second leakage current}|/(|\text{the second voltage}|-|\text{the flatband voltage}(V_{fb})|)^2]\} \div \{\Delta[1 \div (|\text{the second voltage}|-|\text{the flatband voltage}|)]\}.$$

13. The method of claim 10 further comprising the following steps when the value of the first ratio is not greater than the predetermined value:
    applying a third voltage to the first conductive layer, the third voltage is a swing time-dependent DC ramping voltage;
    measuring a third leakage current flowing through the first conductive layer;
    calculating a third proportional value from the third voltage, the third leakage current, and the equation, the third proportional value corresponding to the third voltage;
    calculating a second ratio of the third proportional value to the second proportional value; and
    performing the comparing step to compare the value of the second ratio with the predetermined value.

14. The method of claim 13 wherein the steps (b) to (f) are repeated when the value of the second ratio is not greater than the predetermined value.

15. The method of claim 13 wherein the quality of the insulation layer is degenerated to be not acceptable when the value of the second ratio is greater than the predetermined value.

16. The method of claim 13 wherein the third proportional value is a β3 value corresponding to the third voltage and the β3 value is equal to $$[\{\Delta \ln[|\text{the third leakage current}|/(|\text{the third voltage}|-|\text{a flatband voltage}(V_{fb)i})|^2)]\} \div \{\Delta[1 \div (|\text{the third voltage}|-|\text{the flatband voltage}|)]\}]$$.

17. The method of claim 16 further comprising a step for plotting a β-V curve of each β value respectively corresponding to the first voltage, the second voltage and the third voltage versus the first voltage, the second voltage and the third voltage, a reference β-V curve for the unstress-induced insulation layer is compared with the β-V curve to monitor the quality of the insulation layer.

18. The method of claim 17 wherein the β-V curve comprises at least two regions.

19. The method of claim 17 wherein the absolute value of the β value increases to represent the stress-induced leakage current (SILC) resulting in the increase of each leakage current flowing through the first conductive layer.

20. The method of claim 10 further comprising a step for plotting a β-V curve of each β value versus each voltage, a reference β-V curve for the unstress-induced insulation layer in the capacitor is compared with the β-V curve to monitor the quality of the insulation layer.

21. The method of claim 9 wherein the quality of the insulation layer is degenerated to be not acceptable when the value of the first ratio is greater than the predetermined value.

22. The method of claim 1 wherein the equation is the Fowler-Nordheim tunneling mechanism equation.

23. A method for fast monitoring the stress-induced degradation of an inter layer dielectric disposed between an upper layer interconnection line and a lower layer interconnection line by a wafer acceptance testing (WAT) equipment, the method comprising:
  (a) applying a first voltage to the upper layer interconnection line, the first voltage being a swing time-dependent DC ramping voltage;
  (b) measuring a first leakage current flowing through the upper layer interconnection line to calculate a first proportional value from the first voltage, the first leakage current, and an equation, the first proportional value corresponding to the first voltage;
  (c) applying a second voltage to the upper layer interconnection line, the second voltage being a swing time-dependent DC ramping voltage;
  (d) measuring a second leakage current flowing through the upper layer interconnection line to calculate a second proportional value from the second voltage, the second leakage current, and the equation, the second proportional value corresponding to the second voltage; and
  (e) calculating a first ratio of the second proportional value to the first proportional value.

24. The method of claim 23 wherein the substrate is a silicon substrate of a semiconductor wafer, and the interconnection structure is formed in a testing area of the semiconductor wafer.

25. The method of claim 23 wherein the material composition of both the upper layer interconnection line and the lower layer interconnection line comprise aluminum, copper, or other conductive materials.

26. The method of claim 23 wherein the material composition of the inter layer dielectric comprises silicon oxide, silicon nitride, or silicon oxynitride.

27. The method of claim 23 wherein the inter layer dielectric is an oxygen-contained thin film, and a weight percent of oxygen in the oxygen-contained thin film is smaller than 60%.

28. The method of claim 23 wherein the inter layer dielectric is a low-k material layer, and the material composition of the low-k material layer comprises at least two elements selected from a group consisting Si, C, H, O, N, and F, where a weight percent of oxygen in the low-k material layer is between 0 and 60%.

29. The method of claim 23 further comprising a comparing step to compare the value of the first ratio with a predetermined value.

30. The method of claim 29 wherein the quality of the inter layer dielectric is degenerated to be not acceptable when the value of the first ratio is greater than the predetermined value.

31. The method of claim 29 wherein each proportional value is a β value corresponding to each voltage respectively.

32. The method of claim 31 wherein the first proportional value is a β1 value corresponding to the first voltage and the β1 value is equal to $$[\{\Delta \ln[|\text{the first leakage current}|/(|\text{the first voltage}|-|\text{a flat band voltage}(V_{fb)i})|^2)]\} \div \{\Delta[1 \div (|\text{the first voltage}|-\text{the flatband voltage}|)]\}]$$.

33. The method of claim 31 wherein the second proportional value is a β2 value corresponding to the second voltage and the β2 value is equal to $$[\{\Delta \ln[|\text{the second leakage current}|/(|\text{the second voltage}|-|\text{the flatband voltage}(V_{fb)i})|^2)]\} \div \{\Delta[1 \div (|\text{the second voltage}|-|\text{the flatband voltage}|)]\}]$$.

34. The method of claim 31 further comprising the following steps when the value of the first ratio is not greater than the predetermined value:
  applying a third voltage to the upper layer interconnection line, the third voltage is a swing time-dependent DC ramping voltage;
  measuring a third leakage current flowing through the upper layer interconnection line;
  calculating a third proportional value from the third voltage, the third leakage current, and the equation, the third proportional value corresponding to the third voltage;
  calculating a second ratio of the third proportional value to the second proportional value; and
  performing the comparing step to compare the value of the second ratio with the predetermined value.

35. The method of claim 34 wherein the steps (a) to (e) are repeated when the value of the second ratio is not greater than the predetermined value.

36. The method of claim 34 wherein the quality of the inter layer dielectric is degenerated to be not acceptable when the value of the second ratio is greater than the predetermined value.

37. The method of claim 34 wherein the third proportional value is a β3 value corresponding to the third voltage and the β3 value is equal to $$[\{\Delta \ln[|\text{the third leakage current}|/(|\text{the third voltage}|-|\text{a flatband voltage}(V_{fb)i})|^2)]\} \div \{\Delta[1 \div (|\text{the third voltage}|-|\text{the flatband voltage}|)]\}]$$.

38. The method of claim 37 further comprising a step for plotting a β-V curve of each β value respectively corresponding to the first voltage, the second voltage and the third voltage versus the first voltage, the second voltage and the third voltage, a reference β-V curve for the unstress-induced inter layer dielectric is compared with the β-V curve to monitor the quality of the inter layer dielectric.

39. The method of claim 38 wherein the β-V curve comprises at least two regions.

40. The method of claim 38 wherein the absolute value of the β value increases to represent the stress-induced leakage current (SILC) resulting in the increase of each leakage current flowing through the upper layer interconnection line.

41. The method of claim 31 further comprising a step for plotting a β-V curve of each β value versus each voltage, a reference β-V curve for the unstress-induced inter layer dielectric in the interconnection structure is compared with the β-V curve to monitor the quality of the interconnection structure.

42. The method of claim 23 wherein the equation is the Fowler-Nordheim tunneling mechanism equation.

* * * * *